United States Patent [19]

Vollaro

[11] Patent Number: 5,700,297
[45] Date of Patent: *Dec. 23, 1997

[54] APPARATUS FOR PROVIDING CONSISTENT, NON-JAMMING REGISTRATION OF NOTCHED SEMICONDUCTOR WAFERS

[75] Inventor: Joseph F. Vollaro, Pleasantville, N.Y.

[73] Assignee: IPEC Precision, Inc., Bethel, Conn.

[*] Notice: The term of this patent shall not extend beyond the expiration date of Pat. No. 5,352,249.

[21] Appl. No.: 602,263

[22] Filed: Feb. 20, 1996

Related U.S. Application Data

[63] Continuation of Ser. No. 258,138, Jun. 10, 1994, abandoned, which is a continuation of Ser. No. 46,053, Apr. 12, 1993, abandoned, which is a continuation-in-part of Ser. No. 937,793, Aug. 28, 1992, Pat. No. 5,352,249.

[51] Int. Cl.$^6$ .................................................. B23Q 3/18
[52] U.S. Cl. .................... 29/25.01; 269/305; 269/903
[58] Field of Search .......................... 29/25.01; 269/305, 269/903

[56] References Cited

U.S. PATENT DOCUMENTS

| | | | |
|---|---|---|---|
| 4,189,230 | 2/1980 | Zasio | 269/903 |
| 4,350,866 | 9/1982 | Zasio et al. | 269/903 |
| 4,376,482 | 3/1983 | Wheeler et al. | 198/394 |
| 4,407,627 | 10/1983 | Sato | 414/757 |
| 4,512,283 | 4/1985 | Bonifield | 118/723 |
| 4,820,930 | 4/1989 | Tsutsui et al. | 250/548 |
| 4,887,904 | 12/1989 | Nakazato et al. | 356/375 |
| 4,943,148 | 7/1990 | Mondragon et al. | 269/97 |
| 4,970,772 | 11/1990 | Steere, III | 269/903 |
| 5,180,150 | 1/1993 | Prusak et al. | 269/305 |
| 5,205,028 | 4/1993 | Leonard | 269/903 |
| 5,352,249 | 10/1994 | Vollaro | 29/25.01 |
| 5,533,243 | 7/1996 | Asano | 29/25.01 |

FOREIGN PATENT DOCUMENTS

| | | | |
|---|---|---|---|
| 2431507 | 1/1976 | Germany | 269/903 |
| 59-228720 | 12/1984 | Japan | 29/25.01 |
| 9228720 | 12/1984 | Japan | 29/25.01 |
| WO 88/09303 | 12/1988 | WIPO . | |

*Primary Examiner*—Richard Bueker
*Attorney, Agent, or Firm*—Ware, Fressola, Van Der Sluys & Adolphson LLP

[57] ABSTRACT

An apparatus (40) for providing consistent, non-jamming registration of a notched semiconductor wafer (46) undergoing multiple sequential process work includes a plate (41) upon which the wafer (46) is laid flat. The notch (45) of the notched semiconductor wafer (46) is registered against a first roller (42) that is fixedly mounted to the plate (41). A second roller (43), also fixedly mounted to the plate (41), registers a first point (47) along the circumference of the wafer (46). A third roller (48) is fixedly mounted to a bracket (50) that is movable approximately along the radius of the wafer (46). A force (52) is applied to this bracket (50) resulting in the third roller (48) applying a force against the wafer (46). This resultant force, coupled with the rotating capability of the rollers (42,43,48), allows the wafer (46) to rotate into a proper registration position.

5 Claims, 2 Drawing Sheets

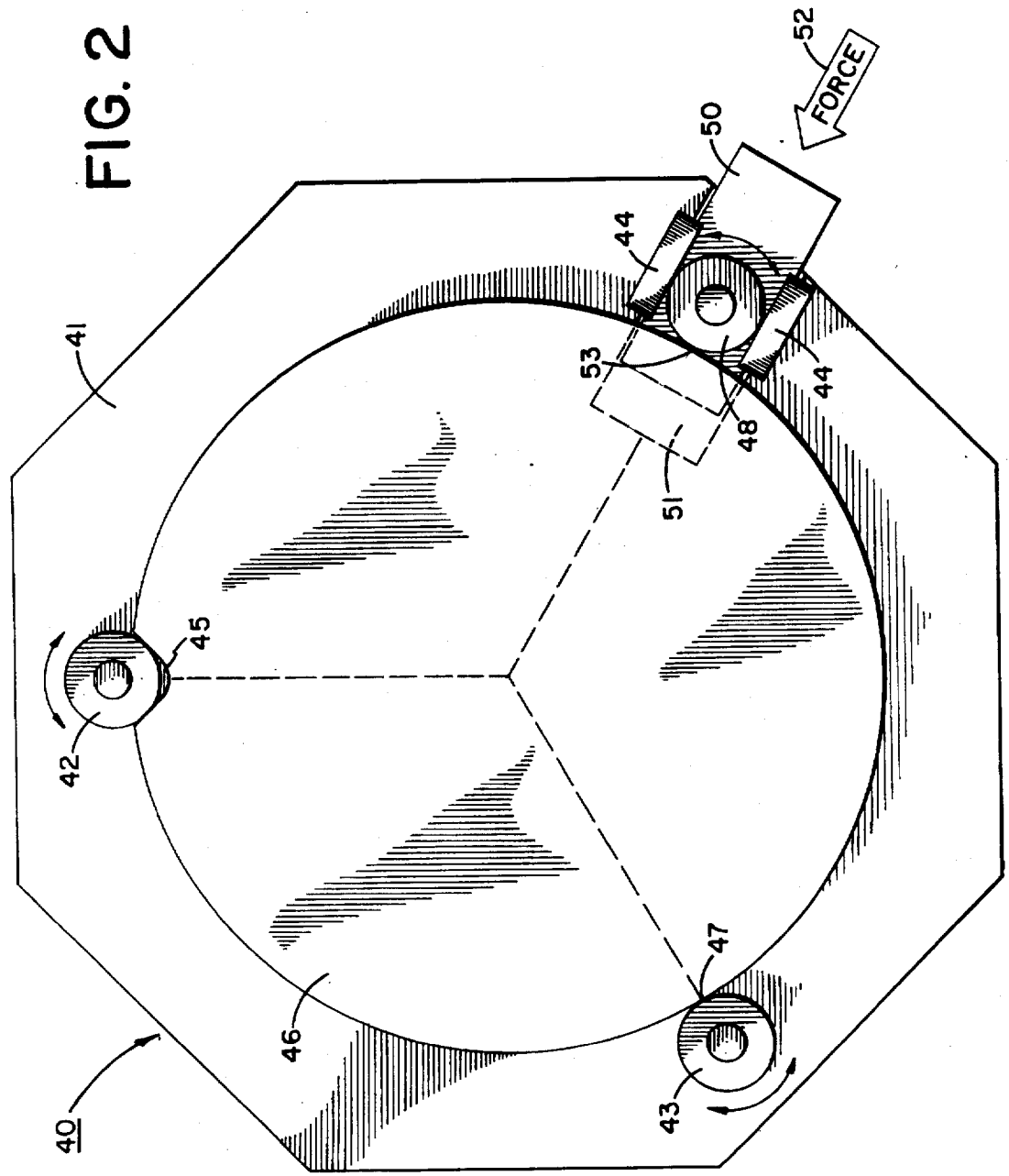

APPARATUS FOR PROVIDING CONSISTENT, NON-JAMMING REGISTRATION OF NOTCHED SEMICONDUCTOR WAFERS

This application is a continuation of application Ser. No. 08/258,138, filed on Jun. 10, 1994, now abandoned, which is a continuation of application Ser. No. 08/046,053, filed Apr. 12, 1993, now abandoned, which is a continuation-in-part of application Ser. No. 07/937,739, filed Aug. 29, 1992, now U.S. Pat. No. 5,352,249.

BACKGROUND OF THE INVENTION

1. Field of the Invention

The present invention relates to the registration of semiconductor wafers undergoing multiple sequential processes, such as a metrology step followed by a thinning and/or etching processes and, in particular, relates to an apparatus that provides consistent, non-jamming registration of notched semiconductor wafers in order to correlate the registration of the semiconductor wafers throughout the multiple sequential processes.

2. Description of the Prior Art

The process of measuring the thickness of an outer material layer of a semiconductor wafer is known as wafer surface metrology. During such a wafer surface metrology process, a semiconductor wafer is mechanically registered to the stage of a thickness measuring instrument. This instrument generates a map that indicates the thickness of an outer material layer of the wafer over an entire surface of the wafer. The outer layer thickness map generated from this metrology process is often used in other processes that thin or etch the material of the outer layer of the wafer to a desired thickness or in a desired location, respectively. These outer layer thinning and etching processes both include some type of tool that is directed onto the surface of the wafer. This tool must be properly positioned along the wafer surface to ensure that the thinning or etching process is performed at the correct location on the wafer surface. To ensure this proper wafer registration, an accurate correlation between the outer layer thickness map and the position of the wafer with respect to the thinning or etching tool is required.

For semiconductor wafers having flats, a current approach for correlating an outer layer thickness map with the position of the wafer in a thinning or etching instrument begins by marking the wafer with a set of alignment fiducials during the metrology process. The wafer is then placed on a larger diameter wafer which serves as a surround. The surround is made of the same material as the wafer undergoing work to maintain a consistent reaction in the thinning or etching process along the wafer edge. The flat of the fiducialized wafer is abutted to a flat registration surface of like wafer material that is taped to the surface of the surround, thereby registering the wafer in one direction. The wafer metrology fiducials are then visually aligned with a corresponding set of scribe marks on an aluminum holding plate, or platen, of the instrument. Once aligned, two additional registration surfaces of like wafer material are abutted against the wafer and taped to the surround to maintain the wafer position. The surround is then taped to the platen so that the thinning or etching process may begin.

It is easily seen that the above-described correlated registration procedure can be time consuming and prone to human error. Furthermore, the above-described procedure does not allow for the correlated registration of notched semiconductor wafers. It is therefore desirable to provide a correlated registration apparatus and procedure that is less time consuming and less prone to human error than the above-described procedure, and that allows correlated registration of notched semiconductor wafers.

Such a desirable correlation registration procedure is achievable with an apparatus, described more thoroughly hereinafter in the detailed description, that is presently used to provide consistent registration of notched semiconductor wafers in metrology and thinning and etching instruments. A disadvantage of this presently used apparatus, however, is that jamming can occur due to friction between the surfaces of the wafer to be registered and the registration surfaces of the apparatus. Thus, it is further desirable to prevent such jamming in this presently used apparatus.

SUMMARY OF THE INVENTION

The present invention contemplates an apparatus that provides consistent registration of notched semiconductor wafers and provides correlation between thinning and etching processes and metrology process data. Such an apparatus is comprised of a metal mounting plate upon which a notched wafer undergoing work lays flat. The wafer is partially registered to the metal plate by two rollers that are fixedly mounted to the plate. The first of these fixedly mounted rollers is positioned on the metal plate such that, when the wafer is properly registered, both walls of the wafer notch are abutted against this roller. The second of these fixedly mounted rollers is positioned on the metal plate such that the wafer, when properly registered, is abutted against this roller at a point on the wafer approximately −120° from the wafer notch. Proper registration is ensured by a third, adjustable roller that is fixedly mounted on a moveable metal bracket which allows the roller to move in an approximately radial direction with respect to the wafer. This third, adjustable roller applies a force against the wafer, at a point on the wafer approximately 120° from the wafer notch, by way of an external force applied to the moveable metal bracket. This force, coupled with the rolling capability of the rollers, ensures that an initially improperly registered wafer will be rotated into the proper registration position. Also, due to the fact that the rollers, by virtue of having rolling element bearings, generally exhibit only a slight mount of friction, or a rolling friction, the effective coefficient of friction between the rollers and the wafer is significantly less than a critical value in the effective coefficient of friction above which wafer jamming occurs. Thus, the wafer will be properly registered without jamming.

It should be noted that unlike the prior art, where the registration surfaces and the surround are fabricated from the same material as the wafer undergoing work, the rollers and associated mounting plate of the present invention are not subject to this same material constraint. As previously described, this constraint is required in the prior art so that consistent thinning and etching processes are maintained along the wafer edge. Although this material constraint does fulfill the object of maintaining consistent processes, an undesirable result of increased material replacement occurs since the thinning and etching processes depreciatively affect the registration and surround materials.

The material constraint and resulting material replacement problems of the prior art are overcome in the present invention by shielding the rollers and the associated mounting plate from the depreciative affects of the thinning and etching processes. Thus, the materials used in the present invention apparatus can be selected with practical considerations such as cost and reliability in mind, instead of impractical and costly material constraints.

The present invention apparatus described above can be used in thinning, etching, and metrology processes, among others, and provides consistent non-jamming registration of notched semiconductor wafers undergoing process work regardless of diameter variations among processed wafers. Furthermore, the use of this apparatus can decrease the registration time associated with the tedious visual alignment procedures of the prior art, while minimizing the potential for human error.

Accordingly, the primary object of the present invention is to provide an apparatus that provides consistent, non-jamming registration of notched semiconductor wafers.

Another object of the present invention is to provide an apparatus that can accurately correlate metrology process data to wafer registration in thinning and etching process instruments.

Another object of the present invention is to provide an apparatus that decreases wafer registration time as compared to prior art registration procedures.

Other objects and advantages of the present invention will become apparent to those skilled in the art from the following detailed description of the invention read in conjunction with the appended claims and the drawings attached hereto.

BRIEF DESCRIPTION OF THE DRAWINGS

In order to facilitate a fuller understanding of the present invention, reference is now made to the drawings. These drawings, are not drawn to scale and should not be construed as limiting the present invention, but are intended to be exemplary only.

FIG. 2 is a plan view of a notched semiconductor wafer registration apparatus embodying the principles of the present invention wherein rollers are used to consistently register notched semiconductor wafers.

DETAILED DESCRIPTION OF THE INVENTION

Figure 1:
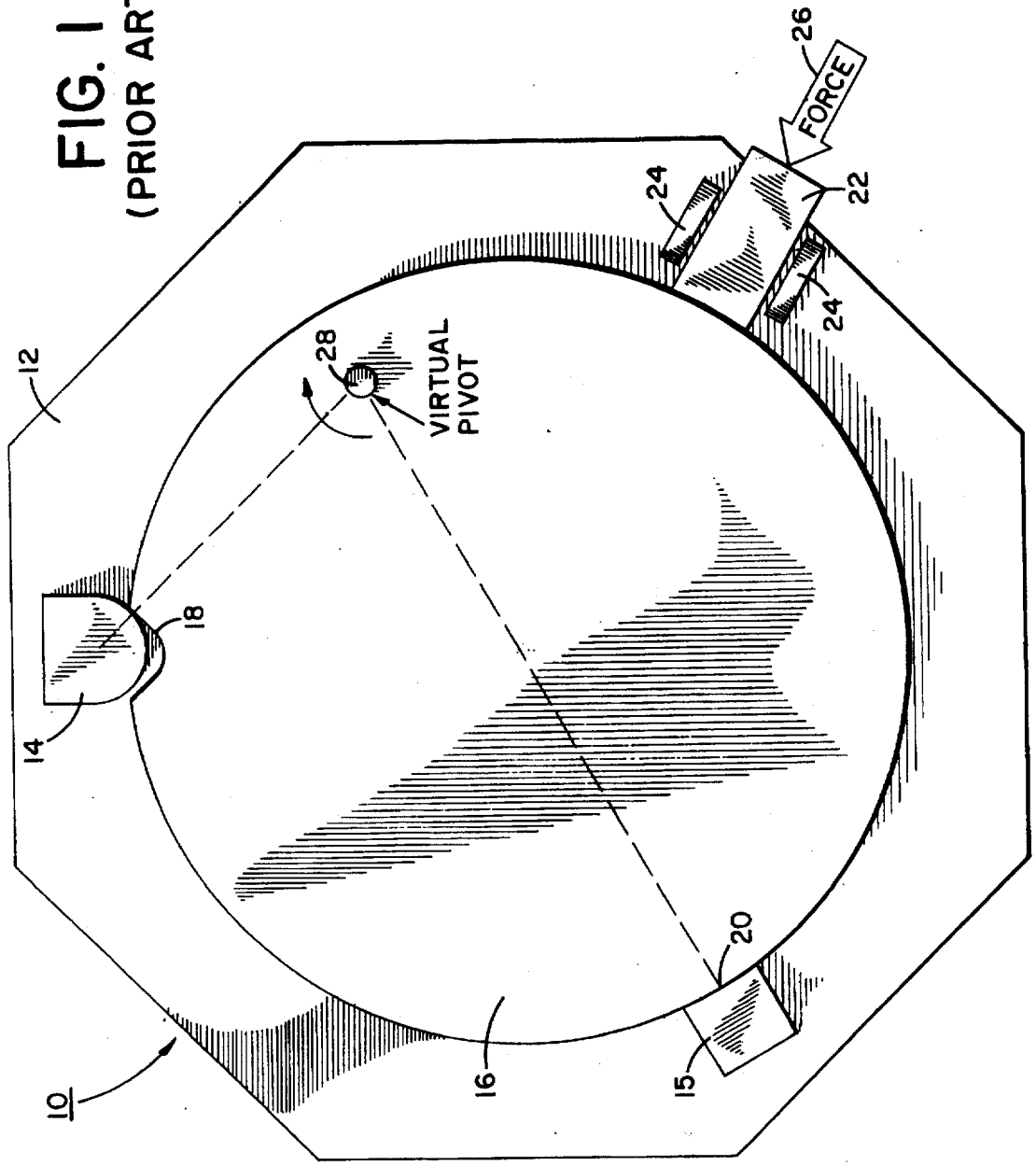
FIG. 1 is a plan view of a prior art notched semiconductor wafer registration apparatus that is experiencing wafer jamming.

Referring to FIG. 1, there is shown a prior art notched semiconductor wafer registration apparatus 10, the use of which can result in wafer-jamming. This prior art apparatus 10 maintains a surround 12 upon which two registration mebers 14, 15 and two guides 24 are fixedly mounted. The first 14 of the two 14,15 fixedly mounted registration members is used for registering a notch 18 of a wafer 16. The second 15 of the two 14, 15 fixedly mounted registration members is positioned to register a point 20 on the wafer 16 approximately −120° from the wafer notch 18.

A third, adjustable registration member 22 is placed between the two fixedly mounted guides 24. In order to securely constrain the wafer 16 a force 26 is applied to this third, adjustable registration member 22, and hence to the wafer 16. This force 26 tends to rotate the wafer 16 about a virtual pivot 28 until contact is made with all of the registration members 14,15,22. However, friction at the points of contact between the wafer 16 and the registration members 14,15,22 tends to impede this necessary rotation. In fact, a critical value in the effective coefficient of friction between the wafer 16 and the registration mebers 14,15,22 exists above which the necessary rotation does not occur regardless of the magnitude of the applied force 26. This results in a friction jam that causes the wafer 16 to be improperly registered as shown.

Referring to FIG. 2, there is shown a notched semiconductor wafer registration apparatus 40 according to the present invention that overcomes the previously mentioned friction-jamming problems of the prior art. This apparatus 40 includes an aluminum plate 41 upon which two rollers 42,43, and two guides 44 are fixedly mounted. The aluminum plate 41 also provides an area upon which a semiconductor wafer 46 can be laid flat. The first 42 of the two 42,43 fixedly mounted rollers is positioned on the plate 41 such that, when the wafer 46 is properly registered, both walls of the wafer notch 45 are abutted against this roller 42. The second 43 fixedly mounted roller is positioned on the plate 41 such that the wafer 46, when properly registered, is abutted against this roller 43 at a point 47 on the wafer 46 approximately −120° from the wafer notch 45.

A third, adjustable roller 48 is fixedly mounted to a sliding aluminum bracket 50 that is positioned between the two guides 44 and within a radial groove 51 that has been fabricated or milled into the aluminum plate 41. As should be apparent from the figure to one with ordinary skill in the art, the purpose of the two guides 44 and the radial groove 51 is to restrict the sliding aluminum bracket 50, and hence the third roller 48, to an approximately radial movement with respect to the wafer 46. Alternatively, the sliding aluminum bracket 50 can be replaced by a pivot arm adapted to pivot about a pivot pin mounted to the plate 41.

To ensure proper wafer registration, an external force 52 is applied to the sliding aluminum bracket 50. This externally applied force 52 results in the third roller 48 applying a similar force against the wafer 46 at a point 53 on the wafer approximately 120° from the wafer notch 45. This resulting force, coupled with the rolling capability of the rollers 42, 43, 48, ensures that an improperly registered wafer will be rotated into the proper registration position, as shown. Also, due to the fact that the rollers 42, 43, 48, by virtue of having rolling element beatings, generally exhibit only a slight amount of friction, or a rolling friction, the effective coefficient of friction between the rollers 42, 43, 48 and the wafer 46 is significantly less than the critical value in the effective coefficient of friction above which wafer jamming occurs. Thus, the wafer 46 will be properly registered without jamming. Of course, proper registration will only occur when the wafer 46 is originally positioned on the plate 41 in a manner that will allow such registration; i.e. the wafer notch 45 must be in sufficiently close proximity to the first roller 42. The present state of the art in wafer handling systems is such that this original positioning condition should be easily achieved.

It should be noted that although the apparatus 40 has been described herein with aluminum being the material of the plate 41 and the other associated components, other practical materials may also be used.

With the present invention notched semiconductor wafer registration apparatus 40 now fully described, it can thus be seen that the objectives set forth above are efficiently attained and, since certain changes may be made in the above described apparatus 40 without departing from the scope of the invention, it is intended that all matter contained in the above description or shown in the accompanying drawings shall be interpreted as illustrative and not in a limiting sense.

What is claimed is:

1. Apparatus for providing consistent orientation of a semiconductor wafer having a notch in the circumference thereof, said apparatus comprising:

a support for said wafer including a flat portion directly underlying and contacting said wafer;

a first rotatable roller fixedly attached to said support, said first roller touching both walls of said notch when a wafer is correctly oriented in said apparatus;

a second rotatable roller fixedly attached to said support, said second roller touching the circumference of said wafer at a first position approximately 120 degrees from said notch; and a third rotatable roller movably attached to said support to move in a direction approximately along a radius of said wafer, said third roller contacting said wafer approximately 120 degrees each from said notch and from said first position when said third rotatable roller is moved to contact said wafer, whereby said wafer can rotate as said first roller abuts both walls of said notch and said second roller simultaneously abuts said wafer.

2. The apparatus as defined in claim 1 wherein said support is made from aluminum.

3. The apparatus as defined in claim 1 and further comprising a bracket movably attached to said support, wherein said bracket moves in a direction approximately along a radius of said wafer, said third roller being fixedly attached to said bracket.

4. The apparatus as defined in claim 3 and further comprising two guides fixedly mounted to said support for guiding said bracket in a direction approximately along a radius of said wafer.

5. The apparatus as defined in claim 4 where said bracket and said guides are made from aluminum.

* * * * *